(12) United States Patent
Minotani et al.

(10) Patent No.: US 12,470,227 B2
(45) Date of Patent: Nov. 11, 2025

(54) SELF-CALIBRATION-FUNCTION-EQUIPPED A/D CONVERTER

(71) Applicant: NTT, Inc., Tokyo (JP)

(72) Inventors: Tadashi Minotani, Musashino (JP); Kenichi Matsunaga, Musashino (JP)

(73) Assignee: NTT, Inc., Tokyo (JP)

( * ) Notice: Subject to any disclaimer, the term of this patent is extended or adjusted under 35 U.S.C. 154(b) by 77 days.

(21) Appl. No.: 18/563,115

(22) PCT Filed: Jun. 16, 2021

(86) PCT No.: PCT/JP2021/022842
§ 371 (c)(1),
(2) Date: Nov. 21, 2023

(87) PCT Pub. No.: WO2022/264307
PCT Pub. Date: Dec. 22, 2022

(65) Prior Publication Data
US 2024/0275396 A1 Aug. 15, 2024

(51) Int. Cl.
*H03M 1/10* (2006.01)
(52) U.S. Cl.
CPC .................. *H03M 1/1014* (2013.01)
(58) Field of Classification Search
CPC .................................................. H03M 1/1014
(Continued)

(56) References Cited

U.S. PATENT DOCUMENTS 5,805,091 A * 9/1998 Sherry ................ H03M 1/1076
340/662
6,084,538 A * 7/2000 Kostelnik ........... H03M 1/1023
341/120

(Continued)

FOREIGN PATENT DOCUMENTS

WO WO 2020/100575 * 5/2020 .......... H03M 1/1009
WO WO 2020/105417 * 5/2020 .......... H03F 3/45475

OTHER PUBLICATIONS

*Overview and Mechanism of A/D Conversion*, A/D Conversion Overview and Mechanism—Memes Support Page, http://memes.sakura.ne.jp/memes/?page_id=1120, Sep. 10, 2018, pp. 1-6.
*Tricks! Implementing a pseudo D/A converter using PWM*, Semiconductor Business—Macnica Inc., https://service.macnica.co.jp/library/107577, May 23, 2018, pp. 1-2.

(Continued)

*Primary Examiner* — Zhen Y Wu
(74) *Attorney, Agent, or Firm* — Workman Nydegger

(57) ABSTRACT

An A/D converter includes: a first reference voltage unit that generates a temperature-compensated reference voltage; a second reference voltage unit that generates a second reference voltage calibrated with the reference voltage; an integration unit that generates an integrated voltage obtained by integrating unit voltages using any one of the reference voltage, the second reference voltage, and a ground voltage as an initial value during calibration; a comparator that compares the integrated voltage with a threshold voltage and outputs a determination signal; a calibration control unit that measures an integration time until the integrated voltage exceeds the threshold voltage from the initial value during calibration and calibrates the unit voltages and an offset voltage of the comparator; and a conversion control unit that converts an input voltage into a digital value using a conversion integration time which is the integration time when the input voltage is an initial value and the second reference voltage during conversion.

2 Claims, 4 Drawing Sheets

(58) Field of Classification Search
USPC .......................................................... 341/120
See application file for complete search history.

(56) References Cited

U.S. PATENT DOCUMENTS

| | | | | |
|---|---|---|---|---|
| 7,319,423 | B2* | 1/2008 | Augusto | H03M 1/125 |
| | | | | 341/158 |
| 8,594,605 | B2* | 11/2013 | Katsube | H03H 11/1252 |
| | | | | 327/552 |
| 8,730,083 | B2* | 5/2014 | Ishii | H03M 1/687 |
| | | | | 341/172 |
| 11,368,162 | B2* | 6/2022 | Minotani | G01R 19/00 |
| 2006/0190746 | A1* | 8/2006 | Boerstler | G06F 1/26 |
| | | | | 713/300 |
| 2012/0194265 | A1* | 8/2012 | Katsube | H03H 11/1252 |
| | | | | 327/554 |
| 2014/0062569 | A1* | 3/2014 | Ghatak | H03K 5/249 |
| | | | | 327/307 |
| 2016/0352349 | A1* | 12/2016 | Yoshioka | H03M 1/124 |
| 2022/0014094 | A1* | 1/2022 | Minotani | H03F 3/45475 |
| 2022/0014207 | A1* | 1/2022 | Minotani | G01R 19/257 |
| 2022/0236753 | A1* | 7/2022 | Minotani | G05F 1/46 |
| 2022/0337262 | A1* | 10/2022 | Minotani | H03M 1/1023 |
| 2022/0393696 | A1* | 12/2022 | Minotani | G01R 19/00 |

OTHER PUBLICATIONS

*Trimming to Improve DAC Accuracy*, EDN Japan, http://ednjapan. com/edn/articles/1611/08/news012.html, May 22, 2018, pp. 1-10.

\* cited by examiner (a) INTEGRATED VOLTAGE (b) CURRENT VALUE

SELF-CALIBRATION-FUNCTION-EQUIPPED A/D CONVERTER

TECHNICAL FIELD

The present invention relates to a self-calibration-function-equipped A/D converter that does not require a measurement device for calibration.

BACKGROUND ART

As is known, an A/D converter is constituted by a comparator and a D/A converter that outputs a known voltage, and a digital value obtained when the output value of the D/A converter is sequentially changed and the smallest output value of the D/A converter at which the output of the comparator changes from a low output voltage to a high output voltage is set is used as the conversion value of the A/D converter (NPL 1). Variation resulting from change over time in the linearity and the offset of the D/A converter leads to change over time in the A/D converter.

Representative D/A converters include an R-2R ladder circuit, a resistor string circuit (NPL 2), and a PWM circuit (NPL 3).

CITATION LIST

Non Patent Literature

[NPL 1] Searched on Jun. 10, 2021, Internet <URL: memes.sakura.ne.jp/memes/?page_id=1120>
[NPL 2] Searched on Jun. 10, 2021, Internet <URL: edn-japn.com/edn/articles/1611/08/news012.html>
[NPL 3] Searched on Jun. 10, 2021, Internet <URL: service.macnica.co.jp/library/107577>

SUMMARY OF INVENTION

Technical Problem

In an R-2R ladder circuit, a high-resolution and high-accuracy variable signal source can be formed with a relatively small number of resistor elements. However, highly-accurate resistors are required on the MSB side in order to enhance the accuracy of output with respect to a setting code.

Although the resistor string circuit has low power consumption and high monotonicity, trial-and-error in the layout design and manufacturing is required, because the linearity of output with respect to a setting code depends on the uniformity and layout of the resistor elements.

Like an R-2R radar circuit or a resistor string circuit, a PWM circuit is advantageous in that it has stable performance since it does not require an array of resistor elements and it can be manufactured with only a digital circuit. However, a high-order low-pass filter for removing ripple noise that appears in the output needs to be designed and manufactured with high frequency accuracy.

Regarding an R-2R radar circuit and a resistor string circuit, it is possible to enhance linearity and accuracy by adjusting the resistor elements and correcting the relationship between the setting code and the output in the final stage of manufacturing. However, in this case, since adjustment and correction are performed while checking the outputs of the R-2R radar circuit and the resistor string circuit, a reference measurement device is required outside the circuit.

Further, the offset voltage of the comparator and the unit voltage of the D/A converter and linearity thereof change over time. Therefore, periodic calibration is essential to maintain conversion accuracy over a long period of time (NPL 2).

However, the adjustment of the offset voltage of the comparator and the unit voltage of the D/A converter requires a reference measurement device outside the A/D converter. For example, a measurement device needs to be brought along in order to calibrate an A/D converter arranged at a remote location. Therefore, there is a problem that it is difficult to calibrate a plurality of A/D converters at remote locations.

The present invention has been devised in view of this problem, and an object of the present invention is to provide a self-calibration-function-equipped A/D converter that does not require a measurement device for calibration.

Solution to Problem

A self-calibration-function-equipped A/D converter according to an aspect of the present invention includes: a first reference voltage unit that generates a temperature-compensated first reference voltage; a second reference voltage unit that generates a second reference voltage calibrated with the first reference voltage; an integration unit that generates an integrated voltage obtained by integrating unit voltages using any one of the first reference voltage, the second reference voltage, and a ground voltage as an initial value during calibration; a comparator that compares the integrated voltage with a threshold voltage and outputs a determination signal; a calibration control unit that measures an integration time until the integrated voltage exceeds the threshold voltage from the initial value during calibration and calibrates the unit voltages and an offset voltage of the comparator; and a conversion control unit that converts an input voltage into a digital value using a conversion integration time which is the integration time when the input voltage is an initial value and the second reference voltage during conversion.

Advantageous Effects of Invention

According to the present invention, it is possible to provide a self-calibration-function-equipped A/D converter that does not require a measurement device for calibration outside thereof.

DESCRIPTION OF EMBODIMENTS

Figure 1:
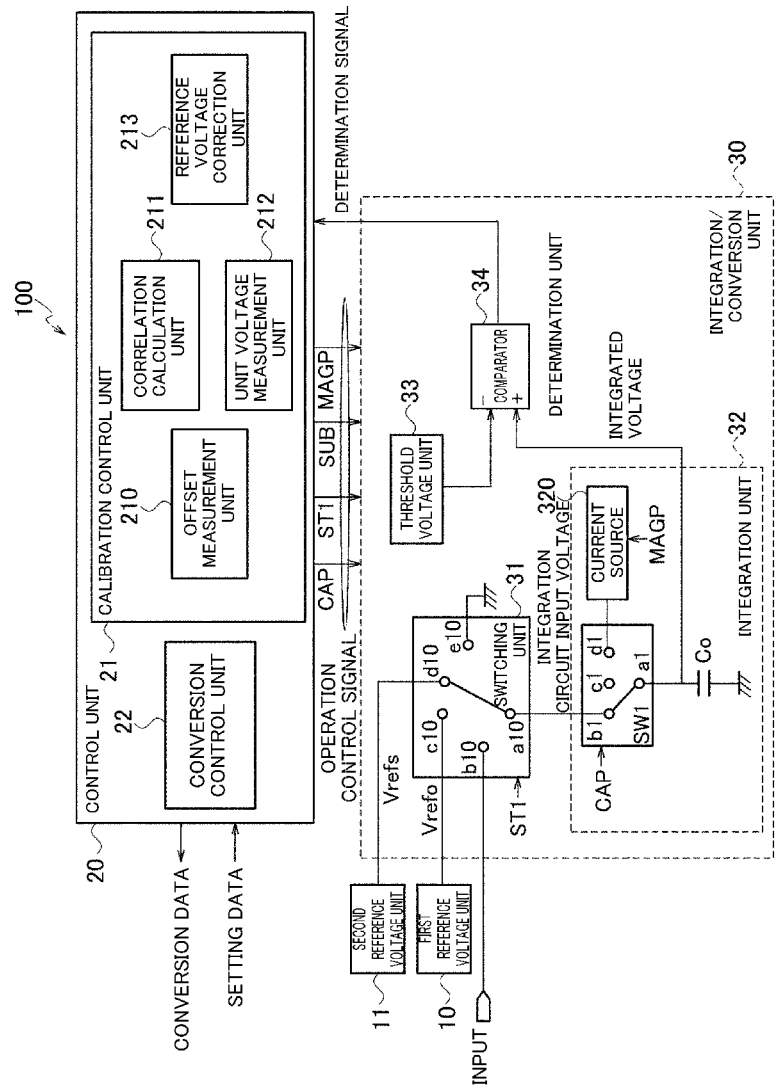
FIG. 1 is a functional block diagram illustrating a configuration example of a self-calibration-function-equipped A/D converter according to an embodiment of the present invention.

An embodiment of the present invention will be described below with reference to the drawings. The same parts in a plurality of drawings are denoted with the same reference numerals, and the description thereof is not repeated.

FIG. 1 is a functional block diagram illustrating a configuration example of a self-calibration-function-equipped A/D converter according to an embodiment of the present invention. In an A/D converter 100 illustrated in FIG. 1, an integration/conversion unit integrates unit voltages to generate an integrated voltage with an input voltage as an initial value, and a comparator compares the integrated voltage with a threshold voltage to convert the integrated voltage into a digital value.

The A/D converter 100 includes a first reference voltage unit 10, a second reference voltage unit 11, an integration/conversion unit 30, and a control unit 20. The integration/conversion unit 30 includes a switching unit 31, an integration unit 32, a threshold voltage unit 33, and a comparator 34.

The control unit 20 is constituted by a calibration control unit 21 and a conversion control unit 22. The calibration control unit 21 includes an offset measurement unit 210, a correlation measurement unit 211, a unit voltage measurement unit 212, and a reference voltage correction unit 213.

The first reference voltage unit 10 generates a first temperature-compensated reference voltage. A second reference voltage unit 11 generates a second reference voltage calibrated with the first reference voltage.

The integration unit 32 generates an integrated voltage obtained by integrating unit voltages using any one of the first reference voltage, the second reference voltage, and the ground voltage as an initial value during calibration.

The comparator 34 compares the integrated voltage with a threshold voltage and outputs a determination signal.

The calibration control unit 21 measures an integration time until the integrated voltage exceeds a threshold voltage from the initial value during calibration, and calibrates the unit voltage and the offset voltage of the comparator 34.

The conversion control unit 22 converts the input voltage into a digital value using the second reference voltage and a conversion integration time which is an integration time when the input voltage is an initial value during conversion.

The operation of each functional unit of the A/D converter 100 will be described in detail.
(Integration Unit)

Figure 2:
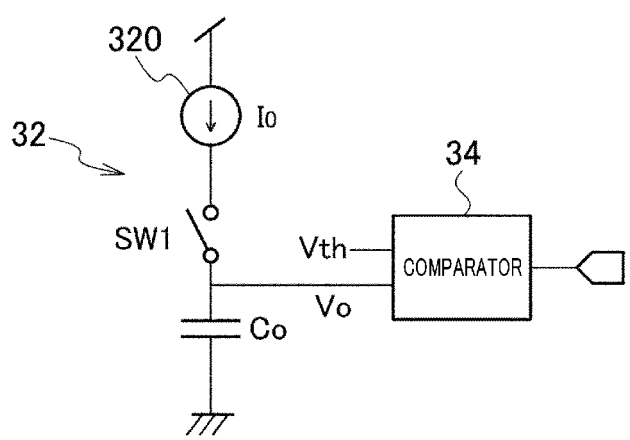
FIG. 2 is a diagram for explaining an operation of an integration unit illustrated in FIG. 1.

FIG. 2 is a diagram illustrating a circuit model of the integration unit 32. The integration unit 32 includes a current source 320, a switch SW1, and a capacitance C0.

FIG. 2 illustrates terminals a1 and d1 of the switch SW1 necessary for explanation of an integration operation of integrating unit voltages, and other terminals are omitted.

In a state where charges corresponding to a voltage Vo, 0 are accumulated in the capacitance C0, the voltage Vo, 1 of the capacitance C0 is expressed by the following equation by one integration operation of disconnecting the terminals a1 and d1 of the switch SW1 after connecting the terminals a1 and d1 for $\Delta t$ seconds.

Math. 1
$$Vo, 1 = \frac{Io}{Co}\Delta t + Vo, 0 \quad (1)$$

At this time, $(I0/C0)\Delta t$ is defined as a unit voltage VG ($VG=(I0/C0)\Delta t$). The voltage Vo, k of the capacitance C0 when the integration operation is repeated k times is expressed by the following equation.

Math. 2
$$Vo, k = kVG + Vo, 0 \quad (2)$$

When the initial value of the voltage of the capacitance C0 is set to Vo, 0, the integration operation is performed k2 times with a coarsely adjusted unit voltages VG2 of a large unit voltage VG, and the integration operation is performed k1 times with a finely adjusted unit voltages VG1 of a small unit voltage VG, the voltage Vo of the capacitance C0 is expressed by the following expression.

Math. 3
$$Vo = k2VG2 + k1VG1 + Vo, 0 \quad (3)$$

It is necessary to calibrate the unit voltage VG and the offset voltage of the comparator 34. The calibration is performed by controlling the integration/conversion unit 30 according to a signal from the calibration control unit 21 and measuring the number of times that integration is performed.

The calibration control unit 21 includes an offset measurement unit 210, a correlation measurement unit 211, a unit voltage measurement unit 212, and a reference voltage correction unit 213. The offset measurement unit 210 performs offset measurement processing.

In the offset measurement processing, the number of times that integration is performed until the voltage Vo of the capacitance C0 reaches a threshold voltage Vth is measured with the second reference voltage Vrefs as an initial value. Although the offset voltage Vofc of the comparator 34 is Vth+Vofc>Vo before the start of integration, the offset voltage Vofc becomes Vth+Vofc<Vo after the integration operation is repeated.

Since the determination signal, which is the output of the comparator 34, changes depending on whether Vth+Vofc>Vo or Vth+Vofc<Vo, the control unit 20 repeats the integration operation after setting the initial value, and measures the number of times that integration is performed until the determination signal changes.

In the offset measurement processing, the following expression is established if the number of times that integration is performed in the coarsely adjusted unit voltages VG2 and the finely adjusted unit voltages VG1 repeated until the determination signal changes after the initial value of the second reference voltage Vrefs is set are set to ko2 and ko1, respectively.

Math. 4
$$Vth + Vofc = ko2VG2 + ko1VG1 + Vrefs \quad (4)$$

The switching between the coarsely adjusted unit voltages VG2 and the finely adjusted unit voltages VG1 can be performed by the following method.

Figure 3:
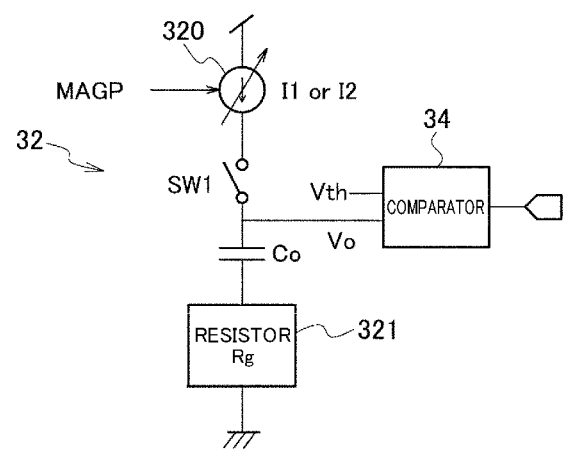
FIG. 3 is a diagram for explaining switching of a unit voltage.

FIG. 3 illustrates a circuit for explaining the switching operation between VG2 and VG1. The current values of a current source 320 at VG2 and VG1 are respectively defined as I2 and I1. The current value is switched according to a signal MAGP from the control unit 20.

Figure 4:
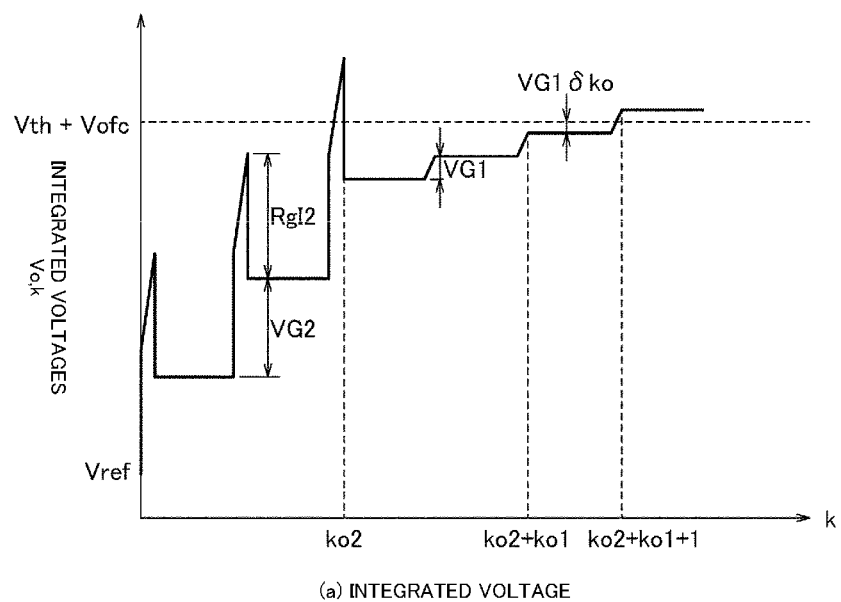
FIG. 4 is a diagram illustrating the relationship between an integrated voltage and a current value in the integration unit illustrated in FIG. 1 and the number of times that integration is performed.
Figure 4:
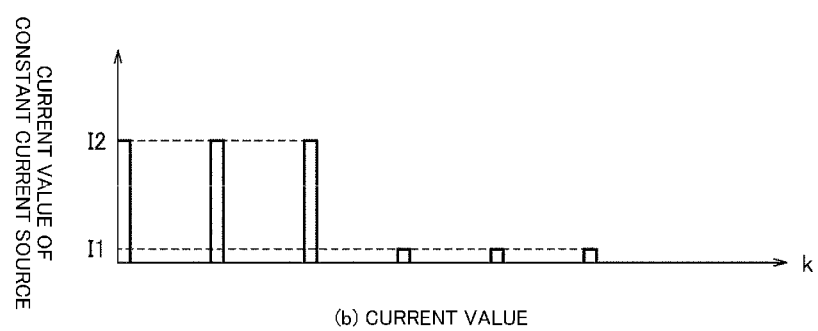

FIG. 4 is a diagram illustrating the relationship between the integrated voltage and current value in the integration unit 32 and the number of times that integration is performed. FIG. 4(a) illustrates the relationship between the number of times that integration is performed and the integrated voltage, and FIG. 4(b) illustrates the relationship between the number of times that integration is performed and the current value.

When integration is performed with VG2, the terminals a1 and d1 of the switch SW1 are connected, and a current of I2 from the current source 320 flows not only through the capacitance C0 but also through the resistor 321. Assuming that the resistance of the resistor 321 is Rg, a voltage of RG·I2 is superposed on the integrated voltage at the moment when the current of I2 flows.

When the terminals a1 and c1 of the switch SW1 are connected and a current of I2 does not flow, a voltage generated in the resistor 321 becomes zero. The integration unit 32 switches the current of the current source 320 to the current for generating VG1 when the voltage when the voltage generated in the resistor 321 is superposed on the integrated voltage when the current for generating VG2 flows from the current source 320 exceeds the sum of the threshold voltage Vth and the offset voltage of the comparator 34.

The correlation measurement unit 211 performs correlation measurement processing for performing integration until the integrated voltage obtained by integrating finely adjusted unit voltages exceeds the threshold Vth after setting the reference voltage to an initial value and integrating the coarsely adjusted unit voltages by a number of times obtained by subtracting one from a first coarse adjustment integration count.

The correlation measurement processing is performed such that integration is performed with VG1 until the determination signal changes after the initial value Vrefs is set and integration is performed with VG2 for ko2−1 times. At this time, when integration is performed with VG1 until the determination signal changes, the following expression is established.

Math. 5
$$Vth + Vofc = (ko2 - 1)VG2 + kp1VG1 + Vrefs \quad (5)$$

The unit voltage measurement unit 212 performs unit voltage measurement processing for measuring a second number of times that rough adjustment integration is performed which is the number of times that integration is performed until an integrated voltage obtained by integrating rough adjustment unit voltages with the ground voltage as an initial value exceeds the threshold voltage Vth, and a second number of times that fine adjustment integration is performed which is the number of times that integration is performed until an integrated voltage obtained by integrating finely adjusted unit voltages exceeds the threshold voltage Vth.

In the unit voltage measurement processing, the integration operation is repeated until the determination signal changes with the ground voltage as an initial value. Assuming that the numbers of times integration is performed with the coarsely adjusted unit voltages VG2 and the finely adjusted unit voltages VG1 are set to ki2 and ki1, respectively, the following expression is established.

Math. 6
$$Vth + Vofc = ki2VG2 + ki1VG1 \quad (6)$$

During conversion, the integration operation is repeated until the determination signal changes with the input voltage Vi as an initial value. Assuming that the numbers of times integration is performed with the coarsely adjusted unit voltages VG2 and the finely adjusted unit voltages VG1 are kv2 and kv1, respectively, the following expression is established.

Math. 7
$$Vth + Vofc = kv2VG2 + kv1VG1 + Vi \quad (7)$$

The input voltage is expressed by the following equation from the numbers ko2, ko1, kp1, ki2, and ki1 measured during calibration and the numbers Kv2 and Kv1 measured during conversion.

Math. 8
$$Vi = \frac{(ki2 - kv2)(kp1 - ko1) + ki1 - kv1}{(ki2 - ko2)(kp1 - ko1) + ki1 - ko1} Vrefs \quad (8)$$

The right side of Equation (8) represents the voltage after conversion.

Since the offset voltage Vofc of the comparator 34 and the current I0 and the capacitance C0 for calibrating the unit voltage vary depending on the temperature and time, if the values Vofc, I0, and C0 are stored in a memory or the like and converted using Expression (7), a conversion error may increase.

In accordance with the A/D converter 100 according to the present embodiment, the conversion error can be reduced because the offset voltage Vofc and the unit voltage are calibrated during calibration.

(Variation of Reference Voltage)

It is known that a reference voltage output from a low-power reference voltage source constituted by an integrated circuit such as a bandgap reference varies with temperature or time. Since the reference voltage Vrefm is stored in advance in the conversion operation of the A/D converter 100, an error occurs between an actual input voltage and the voltage after conversion when the actual standard reference voltage Vrefs varies from the stored reference voltage Vrefm. Assuming that the conversion value at the actual standard reference voltage Vrefs is Vi, s and the conversion value at the stored reference voltage Vrefm is Vi, m, the conversion error is expressed by the following equation.

Math. 9
$$Vi, s - Vi, m = \frac{(ki2 - kv2)(kp1 - ko1) + ki1 - kv1}{(ki2 - ko2)(kp1 - ko1) + ki1 - ko1}(Vrefs - Vrefm) \quad (9)$$

(Calibration Using High-Accuracy Reference Voltage Source)

It is known that a high-accuracy reference voltage source which can compensate for temperature and utilizes a Zener diode or the like has a small variation in the reference voltage with respect to temperature variation and a small drift. However, since the Zener diode has a large voltage and the heater is used for temperature compensation, the power consumption is large. Therefore, it is not suitable to always use the reference voltage source for calibration because the continuous use time of the battery-driven terminal is shortened.

The terminal is used for calibration of the standard reference voltage Vrefs (second reference voltage) at a low frequency, and accordingly the continuous use time and accuracy of the terminal can be ensured.

In this A/D converter 100, a high-accuracy reference voltage Vrefo (first reference voltage) is set to be equal to the reference voltage Vref for storing the reference voltage. When calibration is performed using a high-accuracy reference voltage source, reference voltage calibration processing is performed in addition to offset measurement processing, correlation measurement processing, and unit voltage measurement processing. In the reference voltage calibration processing, a high-accuracy reference voltage Vrefo is set to an initial value, and the integration operation is repeated until the determination signal changes. When the numbers of times integration is performed with the coarsely adjusted unit voltages VG2 and the finely adjusted unit voltages VG1 are defined as kr2 and kr1, respectively, the following equation is established.

Math. 10
$$Vth + Vofc = kr2VG2 + kr1VG1 + Vrefo \quad (10)$$

In case of |Vrefo−Vrefs|<VG2, kr2=ko2. In this case, the relational expression between Vrefo and Vrefs is obtained by taking the difference between Equations (4) and (10).

Math. 11
$$ko1VG1 + Vrefs = kr1VG1 + Vrefo \quad (11)$$

VG1 can be derived from Equations (4) to (6) as follows.

Math. 12
$$VG1 = \frac{1}{(ki2 - ko2)(kp1 - ko1) + ki1 - ko1} Vrefs \quad (12)$$

From Equations (11) and (12), Vrefs can be expressed by the following equation.

Math. 13
$$\frac{ko1 - kr1}{(ki2 - ko2)(kp1 - ko1) + ki1 - ko1} Vrefs + Vrefs = Vrefo \quad (13)$$
$$\frac{(ki2 - ko2)(kp1 - ko1) + ki1 - kr1}{(ki2 - ko2)(kp1 - ko1) + ki1 - ko1} Vrefs = Vrefo$$
$$Vrefs = \frac{(ki2 - ko2)(kp1 - ko1) + ki1 - ko1}{(ki2 - ko2)(kp1 - ko1) + ki1 - kr1} Vrefo$$

When Equation (13) is substituted into Equation (8), the voltage after conversion can be obtained by the following equation.

Math. 14
$$Vi = \frac{(ki2 - kv2)(kp1 - ko1) + ki1 - kv1}{(ki2 - ko2)(kp1 - ko1) + ki1 - kr1} Vrefo \quad (14)$$

Since the stored reference voltage Vrem is equal to Vrefo, the conversion value Vi, m at the stored reference voltage Vrem becomes equal to that in Equation (14), and therefore the error from the actual conversion value Vi, s becomes zero.

In this way, the A/D converter 100 according to the present embodiment has high long-term stability of conversion accuracy and low power consumption.

As described above, the A/D converter 100 includes the first reference voltage unit 10 for generating a temperature-compensated first reference voltage, the second reference voltage unit 11 for generating a second reference voltage calibrated with a reference voltage, the integration unit 32 for generating an integrated voltage obtained by integrating unit voltages using any one of the first reference voltage, the second reference voltage, and a ground voltage as an initial value during calibration, the comparator 34 that compares the integrated voltage with a threshold voltage and outputs a determination signal, the calibration control unit 21 that measures an integration time until the integrated voltage exceeds the threshold voltage from the initial value during calibration and calibrates unit voltages and an offset voltage of the comparator 34, a conversion control unit 22 that converts an input voltage into a digital value using a conversion integration time which is the integration time when the input voltage is set to the initial value and a second reference voltage during conversion. Accordingly, it is possible to provide a self-calibration-function-equipped A/D converter that does not require a measurement device for calibration outside thereof.

Further, the calibration control unit 21 includes the offset measurement unit 210 for measuring a first number of times that integration is performed until an integrated voltage obtained by integrating coarsely adjusted unit voltages exceeds the threshold value using the second reference voltage as the initial value, and a second number of times that integration is performed until an integrated voltage obtained by integrating finely adjusted unit voltages exceeds the threshold value; the correlation measurement unit 211 for measuring a third number of times that integration is performed until an integrated voltage obtained by integrating finely adjusted unit voltages exceeds the threshold voltage after the second reference voltage is set as the initial value and the coarsely adjusted unit voltages are integrated by a number of times obtained by subtracting one from the first number of times that integration is performed; the unit voltage measurement unit 212 for measuring a fourth number of times that integration is performed until an integrated voltage obtained by integrating the coarsely adjusted unit voltages exceeds the threshold voltage using the ground voltage as the initial value and a fifth number of times that integration is performed until an integrated voltage obtained by integrating the finely adjusted unit voltages exceeds the threshold voltage; and the reference voltage correction unit 213 for measuring a sixth number of times that integration is performed until an integrated voltage obtained by integrating the coarsely adjusted unit voltages exceeds the threshold value using the second reference voltage as the initial value and a seventh number of times that integration is performed until an integrated voltage obtained by integrating the finely adjusted unit voltages exceeds the threshold voltage.

According to the embodiment indicated in the above description, it is possible to provide an A/D converter with high long-term stability, in which even if the capacitor and the like forming the offset of the comparator 34 and the integration unit varies due to change over time, it is possible to calibrate the offset of the comparator 34 and the integration unit 32, which is the analog value output unit of the D/A converter.

REFERENCE SIGNS LIST

10: First reference voltage unit
11: Second reference voltage unit

20: Control unit
21: Calibration control unit
22: Conversion control unit
30: Integration/conversion unit
31: Switching unit
32: Integration unit
33: Threshold voltage unit
34: Comparator
100: Self-calibration function-equipped A/D converter
210: Offset measurement unit
211: Correlation measurement unit
212: Unit voltage measurement unit
213: Reference voltage correction unit
320: Current source

The invention claimed is:

1. A self-calibration-function-equipped analog-to-digital (A/D) converter comprising:
a first reference voltage unit configured to generate a temperature-compensated first reference voltage;
a second reference voltage unit configured to generate a second reference voltage calibrated with the first reference voltage;
an integration unit configured to generate an integrated voltage obtained by integrating unit voltages using any one of the first reference voltage, the second reference voltage, and a ground voltage as an initial value during calibration;
a comparator configured to compare the integrated voltage with a threshold voltage and output a determination signal;
a calibration control unit configured to measure an integration time until the integrated voltage exceeds the threshold voltage from the initial value during calibration and calibrate the unit voltages and an offset voltage of the comparator; and
a conversion control unit configured to convert an input voltage into a digital value using a conversion integration time which is the integration time when the input voltage is an initial value and the second reference voltage during conversion.

2. The self-calibration-function-equipped A/D converter according to claim 1, wherein
the calibration control unit includes:
an offset measurement unit configured to measure a first number of times that integration is performed until the integrated voltage obtained by integrating coarsely adjusted unit voltages exceeds the threshold voltage using the second reference voltage as an initial value and a second number of times that integration is performed until the integrated voltage obtained by integrating finely adjusted unit voltages exceeds the threshold voltage;
a correlation measurement unit configured to measure a third number of times that integration is performed until the integrated voltage obtained by integrating the finely adjusted unit voltages exceeds the threshold voltage after setting the second reference voltage as an initial value and integrating the coarsely adjusted unit voltages by a number of times obtained by subtracting one from the first number of times that integration is performed;
a unit voltage measurement unit configured to measure a fourth number of times that integration is performed until the integrated voltage obtained by integrating coarsely adjusted unit voltages exceeds the threshold voltage using the ground voltage as an initial value and a fifth number of times that integration is performed until the integrated voltage obtained by integrating the finely adjusted unit voltages exceeds the threshold voltage; and
a reference voltage correction unit configured to measure a sixth number of times that integration is performed until the integrated voltage obtained by integrating the coarsely adjusted unit voltages exceeds the threshold voltage using the second reference voltage as an initial value and a seventh number of times that integration is performed until the integrated voltage obtained by integrating the finely adjusted unit voltages exceeds the threshold voltage.

* * * * *